United States Patent
Leu et al.

(10) Patent No.: US 8,173,249 B2
(45) Date of Patent: May 8, 2012

(54) SUBSTRATE STRUCTURES APPLIED IN FLEXIBLE ELECTRICAL DEVICES AND FABRICATION METHOD THEREOF

(75) Inventors: Chyi-Ming Leu, Jhudong Township (TW); Yueh-Chuan Huang, Jhudong Township (TW); Jung-Yu Liao, Jhubei (TW)

(73) Assignee: Industrial Technology Research Institute (TW)

( * ) Notice: Subject to any disclaimer, the term of this patent is extended or adjusted under 35 U.S.C. 154(b) by 681 days.

(21) Appl. No.: 12/330,061

(22) Filed: Dec. 8, 2008

(65) Prior Publication Data

US 2010/0068483 A1 Mar. 18, 2010

(30) Foreign Application Priority Data

Sep. 15, 2008 (TW) .............................. 97135351 A

(51) Int. Cl.
*B32B 7/02* (2006.01)
*B05D 5/06* (2006.01)

(52) U.S. Cl. ..................... 428/220; 428/98; 428/212

(58) Field of Classification Search ............... 428/220, 428/212, 98
See application file for complete search history.

(56) References Cited

U.S. PATENT DOCUMENTS

| 2002/0134497 A1* | 9/2002 | Roth .............................. 156/249 |
| 2006/0240202 A1 | 10/2006 | Ishida |
| 2007/0059854 A1 | 3/2007 | Huang et al. |
| 2007/0091062 A1 | 4/2007 | French et al. |
| 2008/0099134 A1 | 5/2008 | Tadakuma |

FOREIGN PATENT DOCUMENTS

| JP | 07-099379 | 4/1995 |
| JP | 2004186324 | 7/2004 |
| JP | 2007251080 | 9/2007 |
| TW | 200709319 | 3/2007 |
| TW | 200713656 | 4/2007 |

OTHER PUBLICATIONS

Notice of Allowance dated Aug. 30, 2011 from corresponding Japanese Application No. 2009-170039.
Notice of Allowance dated Nov. 8, 2011 from corresponding Taiwan Application No. 97135351.
Notice of Allowance dated Nov. 11, 2011 from corresponding Taiwan Application No. 98131014.

* cited by examiner

*Primary Examiner* — Brent Ohern
(74) *Attorney, Agent, or Firm* — Lowe Hauptman Ham & Berner, LLP

(57) ABSTRACT

A substrate structure applied in flexible electrical devices is provided. The substrate structure includes a carrier, a release layer overlying the carrier with a first area and a flexible substrate overlying the release layer and the carrier with a second area, wherein the second area is larger than the first area and the flexible substrate has a greater adhesion force than that of the release layer to the carrier. The invention also provides a method for fabricating the substrate structure.

8 Claims, 3 Drawing Sheets

SUBSTRATE STRUCTURES APPLIED IN FLEXIBLE ELECTRICAL DEVICES AND FABRICATION METHOD THEREOF

CROSS REFERENCE TO RELATED APPLICATIONS

This Application claims priority of Taiwan Patent Application No. 97135351, filed on Sep. 15, 2008, the entirety of which is incorporated by reference herein.

BACKGROUND OF THE INVENTION

1. Field of the Invention

The invention relates to a substrate structure, and more particularly to a substrate structure applied in flexible electrical devices and fabrication method thereof.

2. Description of the Related Art

A flexible display is a development trend for new-generation displays, particularly an active flexible display. Compared to conventional heavy glass substrate with brittleness, development of light flexible plastic substrate is desirable, especially active full-color TFT display panel. Currently, fabrication techniques of active flexible display comprise a-Si TFT, LPTS TFT and OTFT. Display mediums comprise EPD, ECD, LCD and EL.

Fabrication processes are divided into batch type and roll to roll. A TFT apparatus can utilize batch type fabrication processes. However, development of substrate transfer and film separation techniques is required. The flexible display must be transferred to other plastic substrates from glass. For flexible displays using roll to roll fabrication processes, new apparatuses are required and some problems caused by rolling and contact must be overcome.

The batch-type fabrication process has three methods. A PES substrate is bonded to a silicon wafer. A 7" VGA (640×480) plastic LCD is obtained by a low-temperature a-Si TFT technique. In this manner, a transparent substrate material with heat-resistant, low thermal expansion coefficient, low light hysteresis and chemical stability is required, and combined with proper gel materials and an advanced release technique (SEC Corporation). An LPTS TFT back cover is fabricated on glass. The back cover is then removed from glass by laser annealing. The transfer technique plays an important role for this method. In the transfer technique, TFT devices with superior properties can be obtained due to no limitations by plastic substrates concerning fabrication temperature so that conventional transparent plastic substrate can be utilized (Seiko Epson Corporation). Polyimide is coated on glass to develop an a-Si TFT-EPD display. The polyimide substrate is then taken off from the glass by the transfer technique. When the polyimide substrate is directly coated on glass, the fabrication temperature is permitted to achieve 300° C. and above due to heat-resistant thereof. However, using laser annealing to remove glass substrate is also required (Philips Corporation).

BRIEF SUMMARY OF THE INVENTION

One embodiment of the invention provides a substrate structure applied in flexible electrical devices comprising a carrier, a release layer overlying the carrier with a first area and a flexible substrate overlying the release layer and the carrier with a second area, wherein the second area is larger than the first area and the flexible substrate has a greater adhesion force than that of the release layer to the carrier.

One embodiment of the invention provides a method for fabricating a substrate structure applied in flexible electrical devices comprising providing a carrier, forming a release layer on the carrier with a first area and forming a flexible substrate on the release layer and the carrier with a second area, wherein the second area is larger than the first area and the flexible substrate has a greater adhesion force than that of the release layer to the carrier.

The substrate structure applied in flexible electrical devices provided by the invention is simply fabricated using present semiconductor apparatuses, characterized by various adhesion forces of the two release layers to the carrier. A release layer with lower adhesion force is first formed on the carrier with a smaller area. Another release layer with greater adhesion force (such as flexible display substrate) is then formed on the release layer with lower adhesion force and contacts the carrier with a larger area. According to the fabrication method, in TFT processes, the substrate structure is entirely, without peeling off. The release layer with greater adhesion force can be simply separated from the carrier by cutting along the two ends of the release layer with lower adhesion force.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
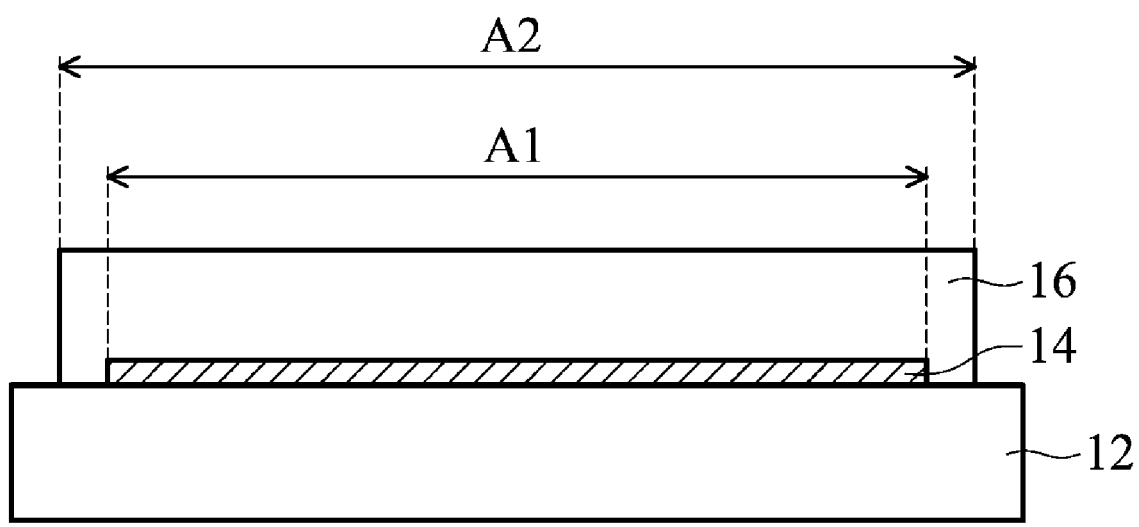
FIG. 1 is a cross-sectional view of a substrate structure applied in flexible electrical devices in an embodiment of the invention.

In an embodiment, a substrate structure applied in flexible electrical devices of the invention is shown in FIG. 1. The substrate structure 10 comprises a carrier 12, a release layer 14 and a flexible substrate 16. The release layer 14 is formed on the carrier 12 with a first area A1. The flexible substrate 16 is formed on the release layer 14 and the carrier 12 with a second area A2. Specifically, the second area A2 is larger than the first area A1 and the flexible substrate 16 has a greater adhesion force than that of the release layer 14 to the carrier 12.

The carrier 12 may comprise glass or silicon wafer. The adhesion force of the release layer 14 to the carrier 12 is 0 B-1 B.

The release layer 14 may comprise parylene or cyclic olefin copolymers (COC). The flexible substrate 16 may be a flexible display substrate, for example, an active flexible display substrate. The adhesion force of the flexible substrate 16 to the carrier 12 is 1-5 B. The flexible substrate 16 may comprise polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN) or polyetherimide (PEI).

The polyimide (PI) flexible substrate 16 has formula (I):

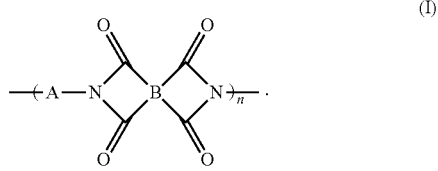

(I)

In formula (I), A may comprise

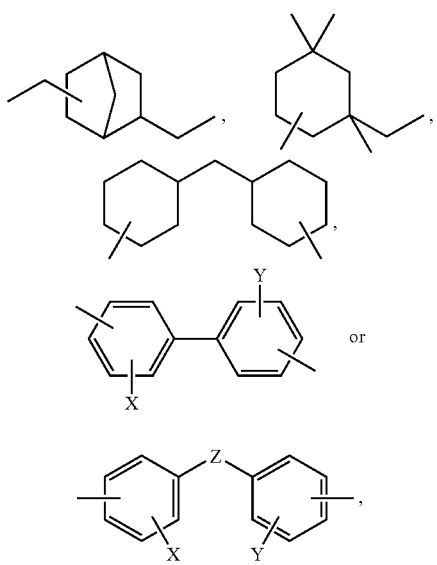

or wherein X and Y may comprise hydrogen, methyl, trifluoromethyl, hydroxyl, —OR, bromine, chlorine or iodine, and Z may comprise—O—, —CH2-, —C(CH3)2-, —SO2-, —Ar—O—Ar—, —Ar—CH2-Ar—, —Ar—C(CH3)2-Ar— or —Ar—SO2-Ar—, wherein R may comprise C1-18 alkyl, and Ar is benzene. B may comprise

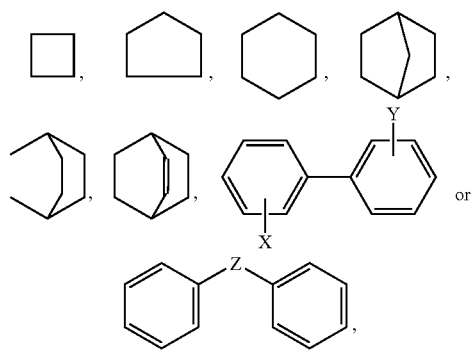

or wherein X and Y may comprise hydrogen, methyl, trifluoromethyl, hydroxyl, —OR, bromine, chlorine or iodine, and Z may comprise —O—, —CH2-, —C(CH3)2-, —SO2-, —Ar—O—Ar—, —Ar—CH2-Ar—, —Ar—C(CH3)2-Ar— or —Ar—SO2-Ar—, wherein R may comprise C1-18 alkyl, and Ar is benzene. n may be an integer greater than 1.

The flexible substrate 16 may further comprise siloxane compounds or silicon dioxide to increase its adhesion force to the carrier 12.

In an embodiment, a method for fabricating a substrate structure applied in flexible electrical devices of the invention is shown in FIGS. 2A-2D.

Figure 2A:
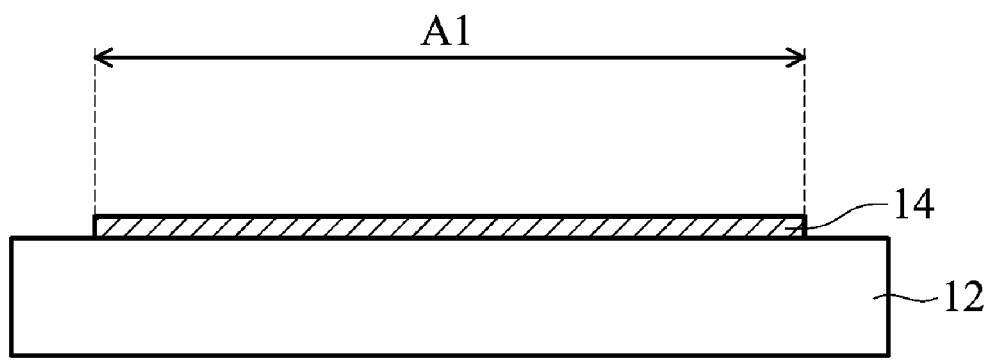
FIGS. 2A-2D are cross-sectional views of a method for fabricating a substrate structure applied in flexible electrical devices in an embodiment of the invention.

Referring to FIG. 2A, a carrier 12 having a release layer 14 formed thereon with a first area A1 is provided. The release layer 14 is formed on the carrier 12 by, for example, coating or evaporation.

Figure 2B:
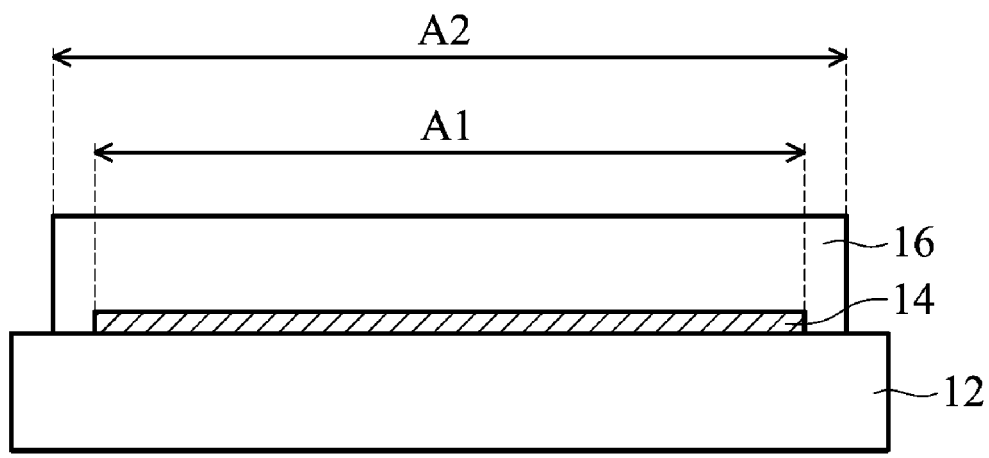

Next, referring to FIG. 2B, a flexible substrate 16 is formed on the release layer 14 and the carrier 12 with a second area A2 by such as coating. Specifically, the second area A2 is larger than the first area A1 and the flexible substrate 16 has a greater adhesion force than that of the release layer 14 to the carrier 12.

Figure 2C:
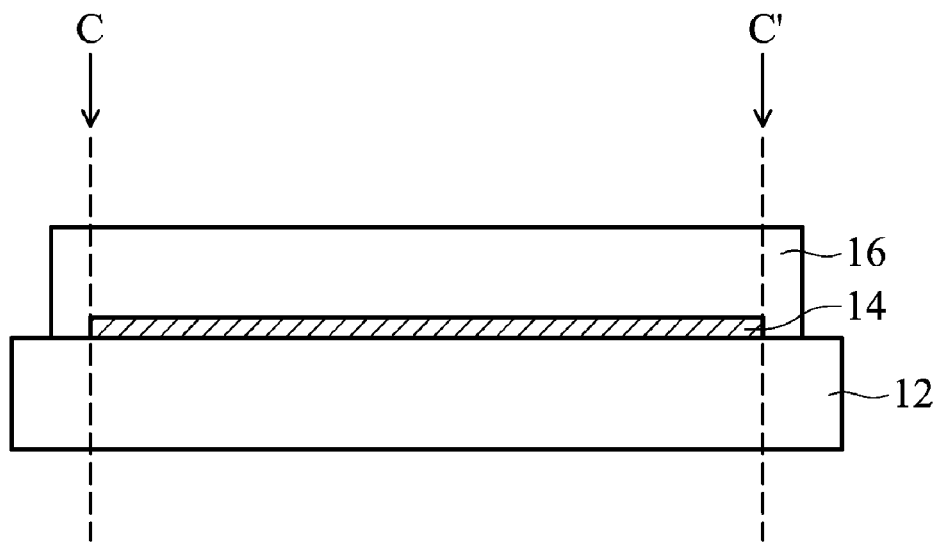
Figure 2D:
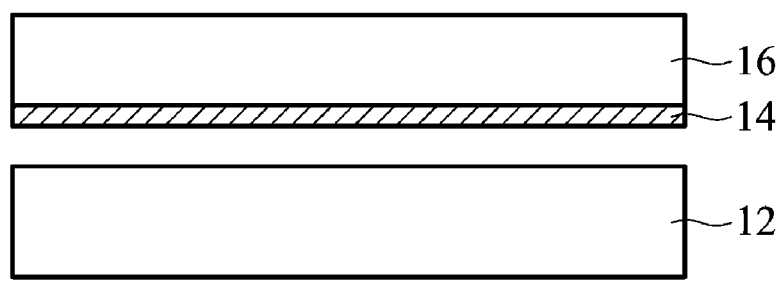

Next, referring to FIG. 2C, a portion of the flexible substrate 16 and the carrier 12 is cut along two ends (C and C') of the release layer 14 to separate the release layer 14, the flexible substrate 16 and the carrier 12, as shown in FIG. 2D.

The substrate structure applied in flexible electrical devices provided by the invention is simply fabricated using present semiconductor apparatuses, characterized by various adhesion forces of the two release layers to the carrier. A release layer with lower adhesion force is first formed on the carrier with a smaller area. Another release layer with greater adhesion force (such as flexible display substrate) is then formed on the release layer with lower adhesion force and contacts the carrier with a larger area. According to the fabrication method, in TFT processes, the substrate structure is entirely, without peeling off. The release layer with greater adhesion force can be simply separated from the carrier by cutting along the two ends of the release layer with lower adhesion force.

A release layer is formed on a TFT glass (for example, 15 cm×15 cm). The area of the release layer is determined by a hollow pad (for example, 8 cm×8 cm). A substrate is then formed on the glass with an area (for example, 10 cm×10 cm) larger than that of the release layer to prepare a substrate structure applied in flexible electrical devices. After device fabrication is completed, a portion of the substrate and the release layer are cut along the two ends or the inside of the release layer to separate the flexible electrical device from the glass.

Example 1

Preparation of Parylene Release Layer

A parylene precursor (parylene dimer) was put into a thermal evaporation apparatus. A clean glass (15 cm×15 cm) covered with a hollow pad (8 cm×8 cm) was placed in a sample room. The parylene precursor was vaporized at 150° C. and decomposed at 650° C. in a vacuum and then conducted into the sample room. Parylene was deposited on the area uncovered by the pad at room temperature. A parylene release layer (8 cm×8 cm) was prepared.

Example 2

Preparation of Arton, Topas and Zeonor Release Layer

Arton, Topas and Zeonor (with 10% solid content dissolved in toluene) were coated on glasses using a scraper. The glass was baked in various ovens (80° C. and 150° C.) respectively for 0.5 hour. A release layer (8 cm×8 cm) was prepared.

Example 3

Preparation of Polyimide (B1317-BAPPm, BB)/Parylene/Glass Substrate Structure

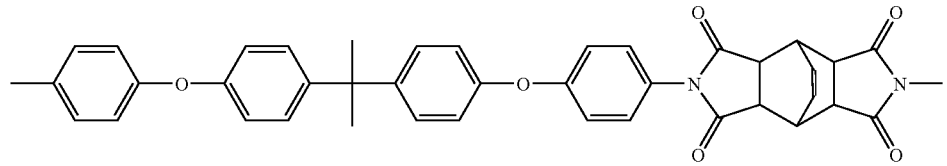

0.0147 mole diphenylamine (BAPPm) was completely dissolved in 32.94 g cresol under nitrogen at room temperature. 0.015 mole dianhydride (B1317) was then added and continuously stirred for 1 hour after dianhydride (B1317) was completely dissolved to form a sticky polyamic acid (PAA) solution. Next, the PAA solution was thermally imidized (220° C.) for 3 hours, and water was simultaneously removed. Methanol was finally added to the resulting solution to precipitate polyimide and baked in a vacuum oven for 12 hours. After baking, polyimide (with 20% solid content) was dissolved in DMAc to form a polyimide solution. The polyimide solution was then coated on the glass plated with 8 cm×8 cm parylene with an area (10 cm×10 cm) using a scraper. The glass was baked in various ovens (80° C. and 150° C.) respectively for 1 hour. A polyimide (BB)/parylene/glass substrate structure was prepared.

Example 4

Preparation of Silicon Dioxide/Polyimide (BB-37)/Parylene/Glass Substrate Structure 3 g silicon dioxide (with 20% solid content dissolved in DMAc) and 7 g B1317-BAPPm (BB) (with 20% solid content dissolved in DMAc) were placed in a sample bottle. 0.3 g amino siloxane was then added to prepare a solution and stirred for 30 min under room temperature. Next, the solution was coated on a glass plated with parylene using a scraper. The glass was then baked in various ovens (80° C. and 150° C.) respectively for 1 hour. A silicon dioxide/polyimide (BB-37)/parylene/glass substrate structure was prepared.

Example 5

Preparation of Silicon Dioxide/Polyimide (BB-55)/Parylene/Glass Substrate Structure 5 g silicon dioxide (with 20% solid content dissolved in DMAc) and 5 g B1317-BAPPm (BB) (with 20% solid content dissolved in DMAc) were placed in a sample bottle. 0.2 g amino siloxane was then added to prepare a solution and stirred for 30 min under room temperature. Next, the solution was coated on a glass plated with parylene using a scraper. The glass was then baked in various ovens (80° C. and 150° C.) respectively for 1 hour. A silicon dioxide/polyimide (BB-55)/parylene/glass substrate structure was prepared.

Example 6

Preparation of Silicon Dioxide/Polyimide (BB-73)/Parylene/Glass Substrate Structure 7 g silicon dioxide (with 20% solid content dissolved in DMAc) and 3 g B1317-BAPPm (BB) (with 20% solid content dissolved in DMAc) were placed in a sample bottle. 0.12 g amino siloxane was then added to prepare a solution and stirred for 30 min under room temperature. Next, the solution was coated on a glass plated with parylene using a scraper. The glass was then baked in various ovens (80° C. and 150° C.) respectively for 1 hour. A silicon dioxide/polyimide (BB-73)/parylene/glass substrate structure was prepared.

Example 7

Preparation of Tetraethoxysilane (TEOS)/Polyimide (BB)/Topas/Glass Substrate Structure 0.2 g tetraethoxysilane (TEOS) and 10 g B1317-BAPPm (BB) (with 20% solid content dissolved in DMAc) were placed in a sample bottle to prepare a solution. Next, the solution was coated on a glass coated with Topas using a scraper. The glass was then baked in various ovens (80° C. and 150° C.) respectively for 1 hour. A tetraethoxysilane (TEOS)/polyimide (BB)/Topas/glass substrate structure was prepared.

Example 8

Preparation of Amino Silane/Polyimide (BB)/Zeonor/Glass Substrate Structure 0.2 g amino silane and 10 g B1317-BAPPm (BB) (with 20% solid content dissolved in DMAc) were placed in a sample bottle to prepare a solution. Next, the solution was coated on a glass coated with Zeonor using a scraper. The glass was then baked in various ovens (80° C. and 150° C.) respectively for 1 hour. An amino silane/polyimide (BB)/Zeonor/glass substrate structure was prepared.

Example 9

Preparation of 3-(Methacryloxy) Propyl Trimethoxy Silane (MPMS)/Polyimide (BB)/Arton/Glass Substrate Structure 0.2 g 3-(methacryloxy)propyl trimethoxy silane (MPMS) and 10 g B1317-BAPPm (BB) (with 20% solid content dissolved in DMAc) were placed in a sample bottle to prepare a solution. Next, the solution was coated on a glass coated with Arton using a scraper. The glass was then baked in various ovens (80° C. and 150° C.) respectively for 1 hour. A 3-(methacryloxy)propyl trimethoxy silane (MPMS)/polyimide (BB)/Arton/glass substrate structure was prepared.

After the substrate structure was prepared, electrical devices were fabricated within the release layer. After device fabrication was completed, a portion of the substrate and the release layer were cut along the two ends or the inside of the release layer to separate the substrate and the electrical device from the glass.

The adhesion force of the release layer and flexible substrate to the carrier is shown in Table 1 and Table 2.

TABLE 1

| Materials | Adhesion force (B) |
|---|---|
| Parylene (Example 1) | 0 |
| Topas (Example 2) | 0 |
| Zeonor (Example 2) | 0 |
| Arton (Example 2) | 0 |
| Polyimide (Example 3) | 1 |
| Polyimide/silicon dioxide (Examples 4-6) | 2-5 |
| Polyimide/TEOS (Example 7) | 5 |
| Polyimide/amino silane (Example 8) | 5 |
| Polyimide/MPMS (Example 9) | 5 |

TABLE 2

| Silicon dioxide content (%) | Adhesion force (B) |
|---|---|
| 0 (Example 3) | 1 |
| 30 (Example 4) | 5 |
| 50 (Example 5) | 3 |
| 70 (Example 6) | 2 |

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A substrate structure applied in flexible electrical devices, comprising:
   a carrier comprising glass or silicon wafer;
   a release layer overlying the carrier with a first area; and
   a flexible substrate overlying the release layer and the carrier with a second area,
   wherein the second area is larger than the first area and the flexible substrate has a greater adhesion force than that of the release layer to the carrier.

2. The substrate structure applied in flexible electrical devices as claimed in claim 1, wherein the adhesion force of the release layer to the carrier is 0 B-1 B.

3. The substrate structure applied in flexible electrical devices as claimed in claim 1, wherein the adhesion force of the flexible substrate to the carrier is 1 B-5 B.

4. A substrate structure applied in flexible electrical devices comprising:
   a carrier;
   a release layer overlying the carrier with a first area; and
   a flexible substrate overlying the release layer and the carrier with a second area,
   wherein the second area is larger than the first area and the flexible substrate has a greater adhesion force than that of the release layer to the carrier, and
   wherein the release layer comprises parylene or cyclic olefin copolymers (COC).

5. A substrate structure applied in flexible electrical devices comprising:
   a carrier;
   a release layer overlying the carrier with a first area; and
   a flexible substrate overlying the release layer and the carrier with a second area,
   wherein the second area is larger than the first area and the flexible substrate has a greater adhesion force than that of the release layer to the carrier, and
   wherein the flexible substrate comprises polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN) or polyetherimide (PEI).

6. The substrate structure applied in flexible electrical devices as claimed in claim 5, wherein the polyimide (PI) has formula (I):

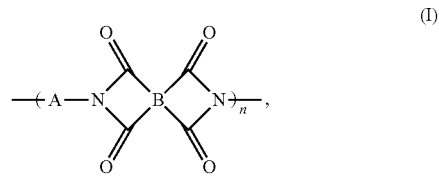

wherein
A comprises

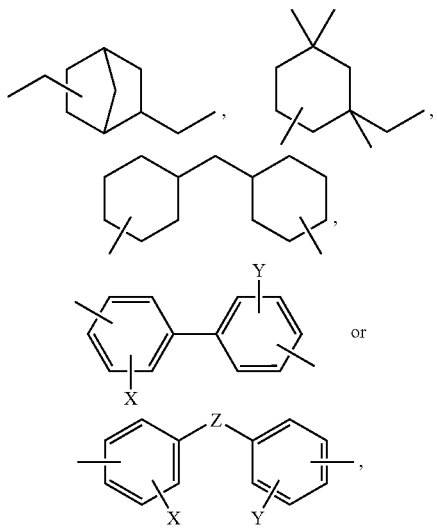

wherein X and Y comprise hydrogen, methyl, trifluoromethyl, hydroxyl, —OR, bromine, chlorine or iodine, and Z comprises —O—, —CH2-, —C(CH3)2-, —Ar—O—Ar—, —Ar—CH2-Ar—, —Ar—C(CH3)2-Ar— or —Ar—SO2-Ar—, wherein R comprises C1-18 alkyl, and Ar is benzene;

B comprises

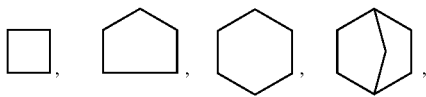

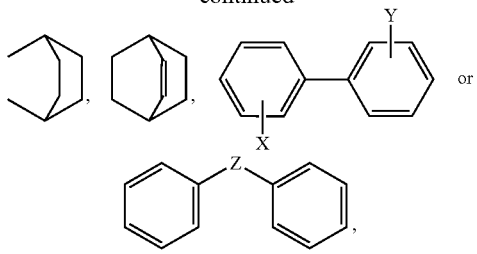 or wherein X and Y comprise hydrogen, methyl, trifluoromethyl, hydroxyl, —OR, bromine, chlorine or iodine, and Z comprises —O—, —CH2-, —C(CH3)2-, —SO2-, —Ar—O—Ar—, —Ar—CH2-Ar—, —Ar—C(CH3)2-Ar— or —Ar—SO2-Ar—, wherein R comprises C1-18 alkyl, and Ar is benzene; and n is an integer greater than 1.

7. The substrate structure applied in flexible electrical devices as claimed in claim 5, wherein the flexible substrate further comprises siloxane compounds.

8. The substrate structure applied in flexible electrical devices as claimed in claim 7, wherein the flexible substrate further comprises silicon oxide.

* * * * *